(12) United States Patent
Norberg et al.

(10) Patent No.: US 10,833,213 B2
(45) Date of Patent: Nov. 10, 2020

(54) OPTICAL CLADDING LAYER DESIGN

(71) Applicant: Juniper Networks, Inc., Sunnyvale, CA (US)

(72) Inventors: Erik Johan Norberg, Santa Barbara, CA (US); Anand Ramaswamy, Pasadena, CA (US); Brian Robert Koch, Brisbane, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/548,260

(22) Filed: Aug. 22, 2019

(65) Prior Publication Data
US 2019/0378941 A1 Dec. 12, 2019

Related U.S. Application Data

(63) Continuation of application No. 15/927,277, filed on Mar. 21, 2018, now Pat. No. 10,431,703, which is a
(Continued)

(51) Int. Cl.
*H01S 5/32* (2006.01)
*H01L 31/0304* (2006.01)
(Continued)

(52) U.S. Cl.
CPC .... *H01L 31/0304* (2013.01); *H01L 31/02327* (2013.01); *H01L 31/0328* (2013.01);
(Continued)

(58) Field of Classification Search
CPC ............................ H01S 5/3211; H01S 5/3213
(Continued)

(56) References Cited

U.S. PATENT DOCUMENTS 7,397,101 B1  7/2008 Masini et al.
9,509,122 B1  11/2016 Norberg et al.
(Continued)

FOREIGN PATENT DOCUMENTS

EP  1850160 A1  10/2007
GB  2392551 A   3/2004

OTHER PUBLICATIONS

"U.S. Appl. No. 13/597,701, Advisory Action dated Nov. 27, 2015", 4 pgs.
(Continued)

*Primary Examiner* — Matthew E Warren
(74) *Attorney, Agent, or Firm* — Schwegman Lundberg & Woessner, P.A.

(57) ABSTRACT

Embodiments of the invention describe apparatuses, optical systems, and methods related to utilizing optical cladding layers. According to one embodiment, a hybrid optical device includes a silicon semiconductor layer and a III-V semiconductor layer having an overlapping region, wherein a majority of a field of an optical mode in the overlapping region is to be contained in the III-V semiconductor layer. A cladding region between the silicon semiconductor layer and the III-V semiconductor layer has a spatial property to substantially confine the optical mode to the III-V semiconductor layer and enable heat dissipation through the silicon semiconductor layer.

20 Claims, 8 Drawing Sheets

Related U.S. Application Data continuation of application No. 15/361,865, filed on Nov. 28, 2016, now Pat. No. 9,960,297, which is a continuation of application No. 13/597,701, filed on Aug. 29, 2012, now Pat. No. 9,509,122.

(51) Int. Cl.

| | | |
|---|---|---|
| *H01S 5/024* | (2006.01) | |
| *H01L 31/109* | (2006.01) | |
| *H01L 31/0328* | (2006.01) | |
| *H01L 31/0232* | (2014.01) | |
| *H01S 5/02* | (2006.01) | |
| *H01S 5/026* | (2006.01) | |
| *H01S 5/10* | (2006.01) | |

(52) U.S. Cl.
CPC ........ *H01L 31/109* (2013.01); *H01S 5/02461* (2013.01); *H01S 5/3211* (2013.01); *H01S 5/3213* (2013.01); *H01S 5/021* (2013.01); *H01S 5/026* (2013.01); *H01S 5/1032* (2013.01); *Y02E 10/544* (2013.01)

(58) Field of Classification Search
USPC ........................................ 257/184, 185, 189
See application file for complete search history.

(56) References Cited

U.S. PATENT DOCUMENTS

| | | | |
|---|---|---|---|
| 9,960,297 | B2 | 5/2018 | Norberg et al. |
| 2002/0118941 | A1 | 8/2002 | Notomi et al. |
| 2004/0026779 | A1 | 2/2004 | Cai et al. |
| 2006/0198414 | A1 | 9/2006 | Hashimoto |
| 2007/0147725 | A1 | 6/2007 | Crespi et al. |
| 2007/0274655 | A1 | 11/2007 | Keyser et al. |
| 2008/0044127 | A1 | 2/2008 | Leising et al. |
| 2010/0019385 | A1 | 1/2010 | Bartley |
| 2011/0150024 | A1* | 6/2011 | Dupont ................ H01S 5/1032 372/50.11 |
| 2011/0235962 | A1 | 9/2011 | Shubin et al. |
| 2017/0077325 | A1 | 3/2017 | Norberg et al. |
| 2018/0219112 | A1 | 8/2018 | Norberg et al. |

OTHER PUBLICATIONS

"U.S. Appl. No. 13/597,701, Examiner Interview Summary dated Mar. 20, 2015", 3 pgs.
"U.S. Appl. No. 13/597,701, Examiner Interview Summary dated Oct. 21, 2014", 3 pgs.
"U.S. Appl. No. 13/597,701, Final Office Action dated Jun. 10, 2015", 11 pgs.
"U.S. Appl. No. 13/597,701, Final Office Action dated Jun. 18, 2014", 13 pgs.
"U.S. Appl. No. 13/597,701, Non Final Office Action dated Feb. 18, 2016", 12 pgs.
"U.S. Appl. No. 13/597,701, Non Final Office Action dated Sep. 3, 2013", 10 pgs.
"U.S. Appl. No. 13/597,701, Non Final Office Action dated Dec. 15, 2014", 13 pgs.
"U.S. Appl. No. 13/597,701, Notice of Allowance dated Oct. 12, 2016", 8 pgs.
"U.S. Appl. No. 13/597,701, Response filed Mar. 3, 2014 to Non Final Office Action dated Sep. 3, 2013", 11 pgs.
"U.S. Appl. No. 13/597,701, Response filed Apr. 2, 2015 to Non Final Office Action dated Dec. 15, 2014", 12 pgs.
"U.S. Appl. No. 13/597,701, Response filed May 20, 2016 to Non Final Office Action dated Feb. 18, 2016", 10 pgs.
"U.S. Appl. No. 13/597,701, Response filed Jul. 19, 2013 to Restriction Requirement dated Jun. 19, 2013", 7 pgs.
"U.S. Appl. No. 13/597,701, Response filed Oct. 17, 2014 to Final Office Action dated Jun. 18, 2014", 13 pgs.
"U.S. Appl. No. 13/597,701, Response filed Oct. 26, 2015 to Final Office Action dated Jun. 10, 2015", 11 pgs.
"U.S. Appl. No. 13/597,701, Response filed Dec. 8, 2015 to Advisory Action dated Nov. 27, 2015", 9 pgs.
"U.S. Appl. No. 13/597,701, Restriction Requirement dated Jun. 19, 2013", 10 pgs.
"U.S. Appl. No. 15/361,865, Non Final Office Action dated Oct. 6, 2017", 8 pgs.
"U.S. Appl. No. 15/361,865, Notice of Allowance dated Jan. 6, 2018", 5 pgs.
"U.S. Appl. No. 15/361,865, Preliminary Amendment filed Dec. 7, 2016", 7 pgs.
"U.S. Appl. No. 15/361,865, Response filed Dec. 1, 2017 to Non Final Office Action dated Oct. 6, 2017", 8 pgs.
"U.S. Appl. No. 15/927,277, Notice of Allowance dated May 21, 2019", 10 pgs.
"U.S. Appl. No. 15/927,277, Restriction Requirement dated Mar. 5, 2019", 6 pgs.
"European Application Serial No, 13003901.9, Extended European Search Report dated May 2, 2014", 11 pgs.
Liang, D, et al., "Optimization of Hybrid Silicon Microring Lasers", IEEE Photonics Journal, vol. 3, No. 3, (Jun. 2011), 9 pgs.
Sysak, M. N, et al., "Hybrid Silicon Laser Technology: A Thermal Perspective", JSTQE, (2011), 1490-1498.
U.S. Appl. No. 13/597,701, filed Aug. 29, 2012, Optical Cladding Layer Design, U.S. Pat. No. 9,509,122.
U.S. Appl. No. 15/361,865, filed Nov. 28, 2016, Optical Cladding Layer Design, U.S. Pat. No. 9/960,297.
U.S. Appl. No. 15/927,277, filed Mar. 21, 2018, Optical Cladding Layer Design.

\* cited by examiner

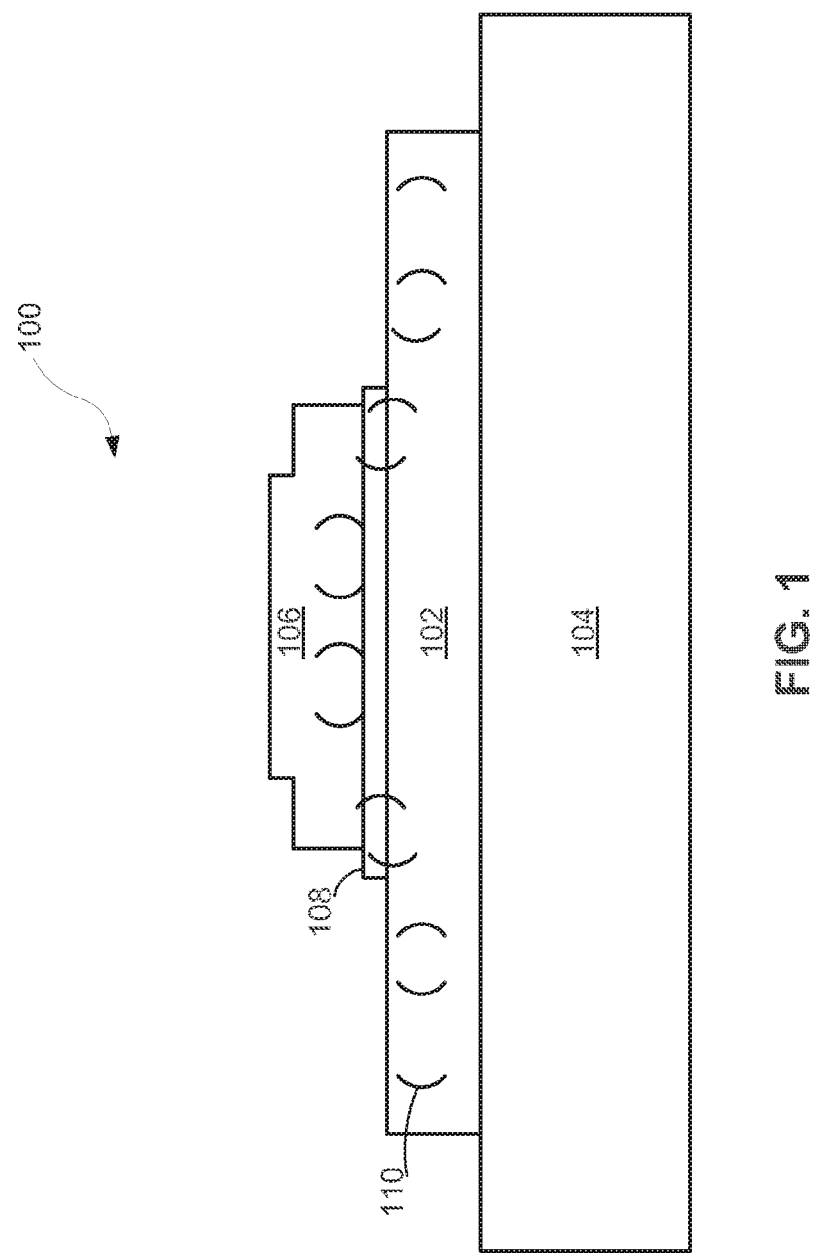

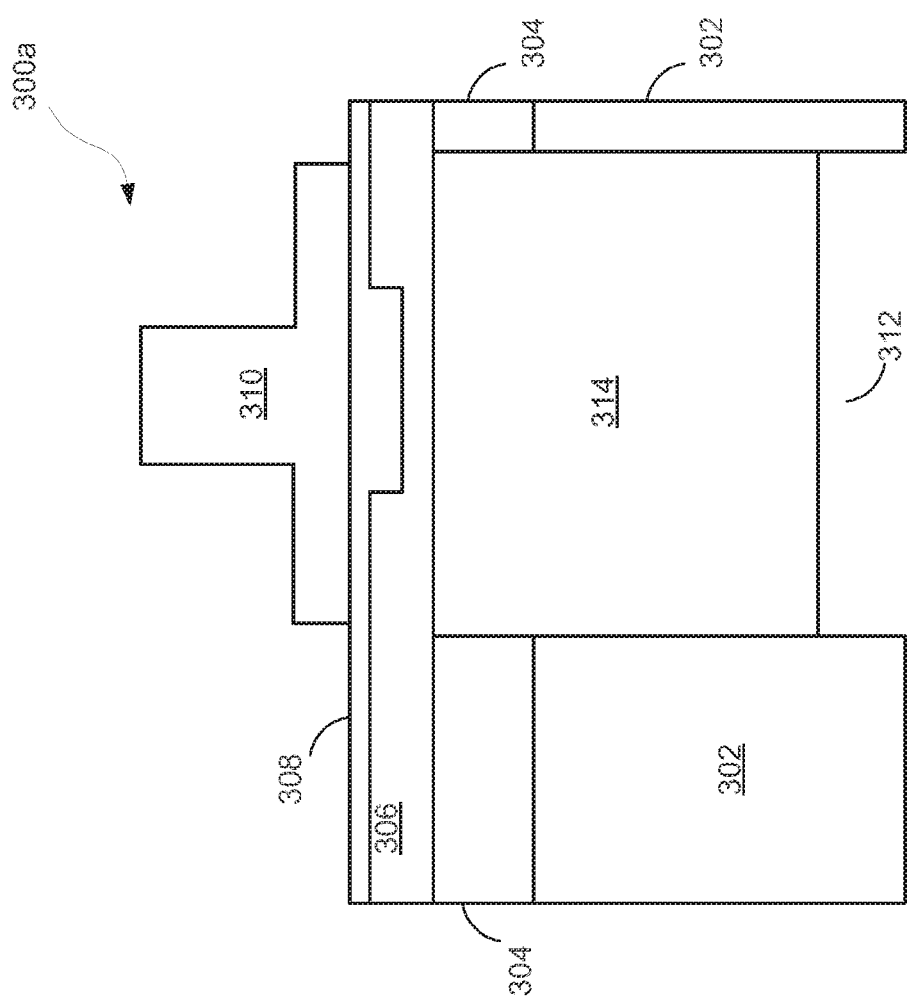

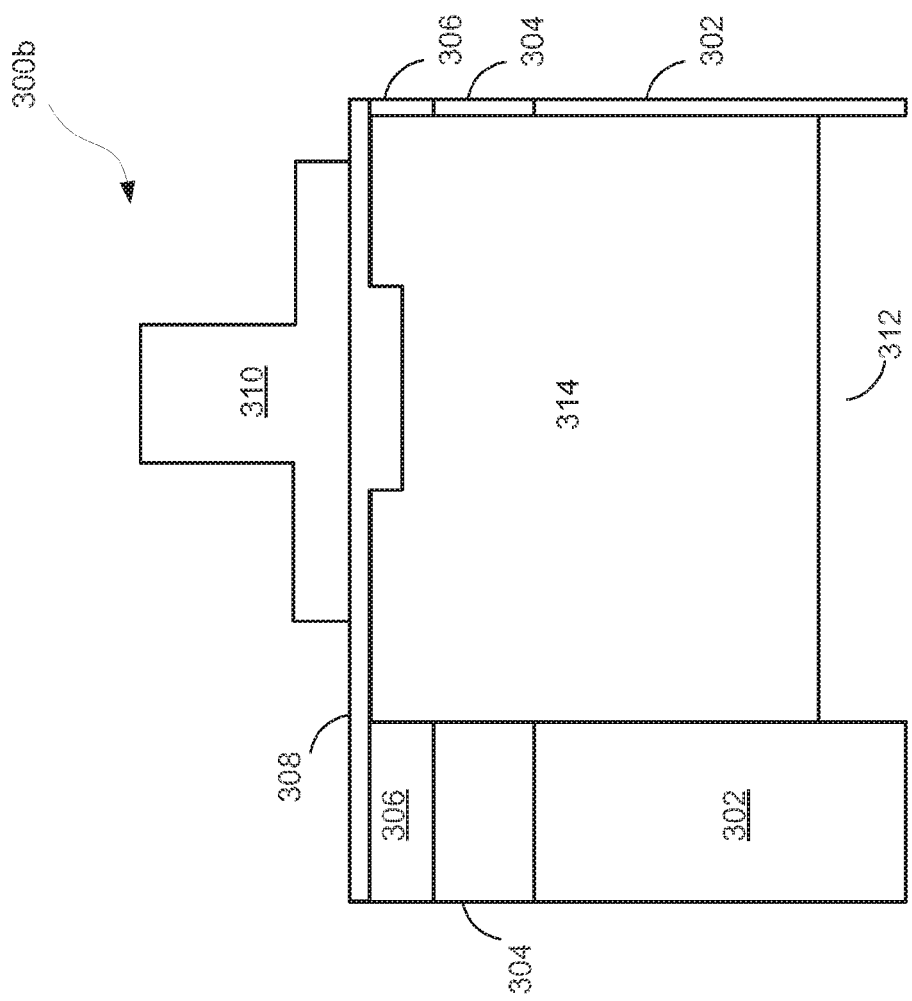

OPTICAL CLADDING LAYER DESIGN

PRIORITY CLAIM

This application is a continuation of U.S. patent application Ser. No. 15/927,277, filed Mar. 21, 2018, which is a continuation of U.S. patent application Ser. No. 15/361,865, filed Nov. 28, 2016, which is a continuation of U.S. patent application Ser. No. 13/597,701, filed Aug. 29, 2012, all of which are incorporated by reference herein in their entirety.

TECHNICAL FIELD

This disclosure relates generally to the field of photonics, and in particular but not exclusively, to thermal performance of optical devices.

BACKGROUND

Optical devices generally include one or more cladding layers around optical waveguides to confine their optical modes. An example of a cladding layer is a buried oxide (BOX) layer on a silicon on insulator (SOI) wafer. Cladding layers are generally made from materials with low thermal conductivity. Low thermal conductivity cladding layers may cause thermal dissipation problems for active devices such as amplifiers and photodetectors.

Some current implementations attempt to solve thermal dissipation problems with polysilicon shunts in the buried oxide layer; however, polysilicon shunts in the buried oxide layer have drawbacks. For example, polysilicon shunts are wide, and thus provide a radiation path for the optical mode. Therefore, current implementations require placement of polysilicon shunts a certain lateral distance away from the optical mode. The effectiveness of such polysilicon shunts is greatly reduced because the shunts are located far from the active region of the device where heat dissipation is greatest.

Additionally, polysilicon has a low thermal conductivity (between three to ten times lower than crystalline silicon) and therefore thermal performance improvements due to polysilicon shunts as currently implemented are marginal.

DESCRIPTION OF THE DRAWINGS

Non-limiting and non-exhaustive embodiments of the invention are described with reference to the following figures, wherein like reference numerals refer to like parts throughout the various views unless otherwise specified. It should be appreciated that the following figures may not be drawn to scale.

FIG. 1 is a block diagram of a waveguide illustrating the location of the optical mode in a hybrid device, according to an embodiment of the invention.

FIG. 3a and FIG. 3b are block diagrams of a hybrid device with a back-filled region and a cladding layer having a spatial property to enable heat dissipation, according to an embodiment of the invention.

Figure 2A:
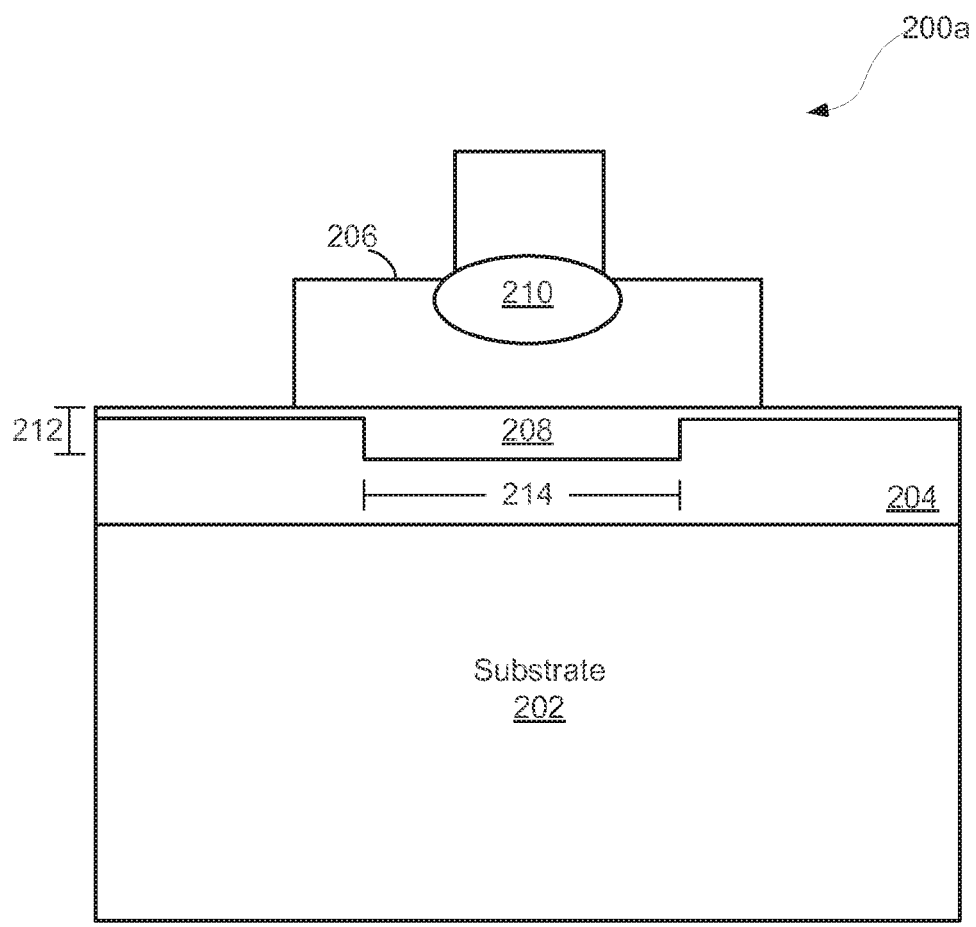
FIG. 2a is a block diagram of a hybrid device including a cladding region with a spatial property to enable heat dissipation, according to an embodiment of the invention.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of an apparatus, system, and method related to utilizing an optical cladding layer are described herein. One embodiment of the invention utilizes an optical cladding layer for a hybrid optical device. A hybrid optical device includes a waveguide having a silicon semiconductor layer, a III-V semiconductor layer, and a cladding region between the silicon semiconductor layer and the III-V semiconductor layer. Cladding material serves to confine an optical waveguide mode. For example, cladding material can be composed of a low refractive index (relative to the core of the waveguide) which serves to confine an optical waveguide mode within an adjacent high refractive index material. An optical mode is confined within a waveguide if it is substantially confined such that an insignificant amount of loss occurs.

According to one embodiment, an optical cladding region has a spatial property to improve heat dissipation from the hybrid device without significantly affecting the optical performance of the optical device. For example, the optical cladding region's spatial properties decrease thermal impedance of the device while maintaining the device's ability to guide light without excessive radiation loss.

Examples of spatial properties of a hybrid devices' cladding region which improve thermal performance include a thickness, width, and/or shape of the cladding region. In one embodiment, a hybrid device's cladding region is underneath the active region of the optical device, which enables efficient heat dissipation from the device. In one embodiment, the cladding layer is as thin as possible underneath the active region of the device without exceeding acceptable radiation loss. In another embodiment, the cladding layer has a short width underneath the active region. In yet another embodiment, the cladding layer has a shape formed in part by one or more thermal shunts of sub-wavelength size. In one embodiment, the device further includes a back-filled region under the silicon semiconductor layer to improve thermal performance. Different embodiments of the invention may include one or more of these features in various combinations. Thus, in some embodiments, the performance of active hybrid III-V silicon devices can be improved through lowered thermal impedance without significant degradation of the optical properties of the device.

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment.

Furthermore, the particular features, structures, or characteristics may be combined in any suitable manner in one or more embodiments.

FIG. 1 is a block diagram of a waveguide illustrating the location of the optical mode in a hybrid device, according to one embodiment of the invention. Device 100 illustrates a hybrid device (e.g., a hybrid silicon/III-V device). Hybrid device 100 may be an active device such as an amplifier or a photodetector, or any other optical device with a waveguide. Hybrid device 100 includes substrate layer 104, silicon semiconductor layer 102, III-V semiconductor layer 106, and cladding region 108 between silicon semiconductor layer 102 and III-V semiconductor layer 106. Cladding region 108 can include any material capable of confining the optical mode to III-V semiconductor layer 106 in the active region of the device. For example, in one embodiment, cladding region 108 is a silicon oxide layer. In another embodiment, cladding region 108 includes any dielectric or polymer material. The thickness of cladding region 108 is thin enough to enable evanescent coupling between silicon semiconductor layer 102 and the HI-V semiconductor layer 106. For example, in one embodiment, cladding region 108 is 100 nm thick.

In one embodiment, mode transformers (not shown) provide an adiabatic transition between silicon semiconductor layer 102 and III-V semiconductor layer 106. The optical mode within device 100 is substantially confined in III-V semiconductor layer 106 (illustrated by electromagnetic field 110) in the active region of device 100. For example, a majority of the electromagnetic field of the optical mode resides in III-V semiconductor layer 106. Cladding region 108 vertically confines the optical mode to III-V semiconductor layer 106 in the active region such that the optical mode no longer interacts with layer 104. In one such embodiment, layer 104 does not need to include a cladding layer, and may be a silicon substrate or any insulating, conducting, or semiconducting layer. In one embodiment, guiding the optical mode primarily in the III-V semiconductor layer results in larger gain available for amplification. As described below, cladding region 108 has a spatial property to enable heat dissipation in device 100.

Figure 2B:
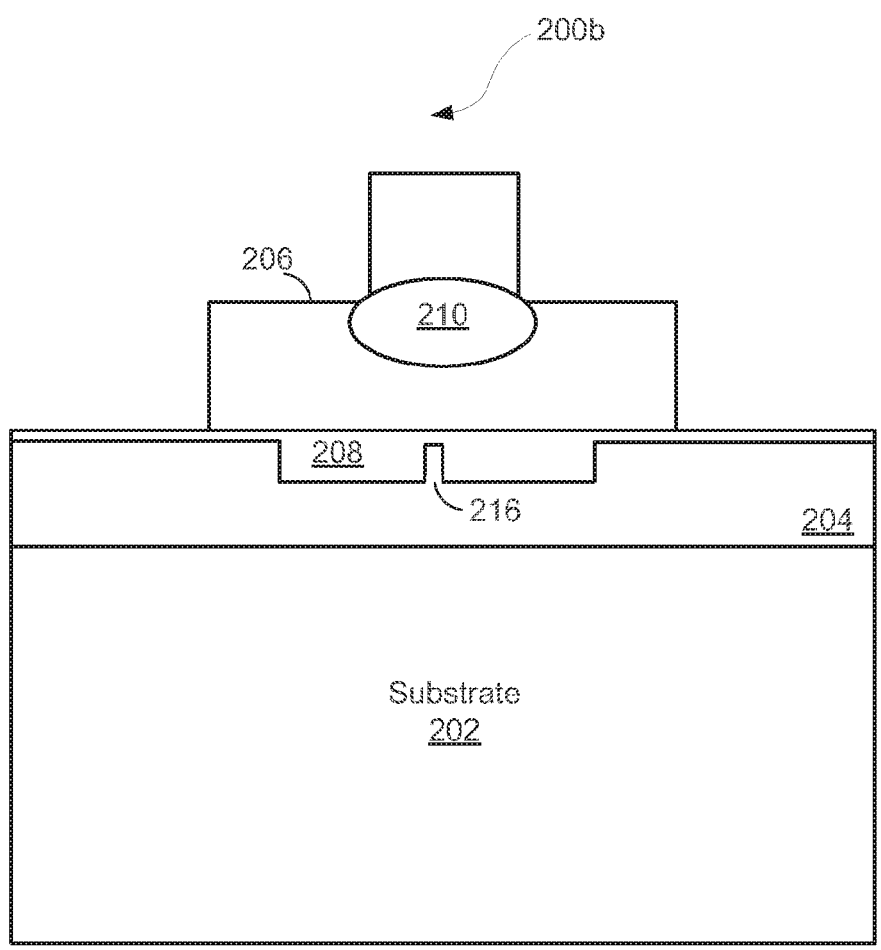
FIG. 2b is another block diagram of a hybrid device including a cladding region with a spatial property to enable heat dissipation, according to an embodiment of the invention.
Figure 2C:
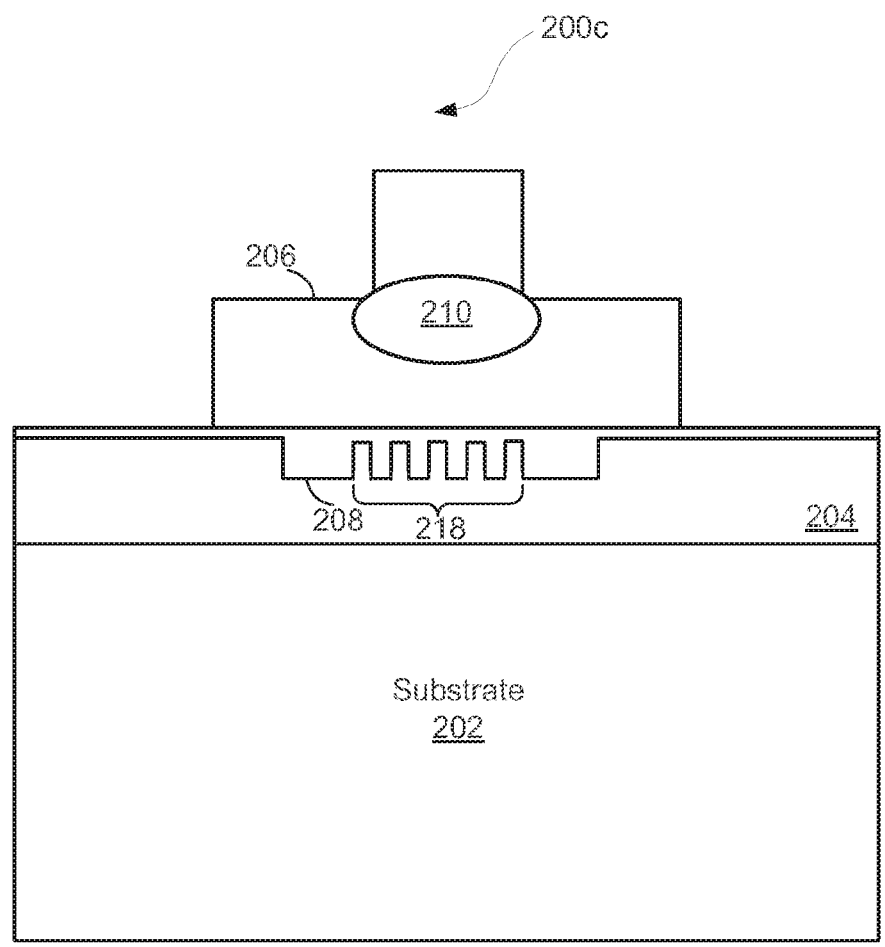
FIG. 2c is another block diagram of a hybrid device including a cladding region with a spatial property to enable heat dissipation, according to an embodiment of the invention.

FIGS. 2a-2c are block diagrams of hybrid devices including cladding regions with spatial properties to enable heat dissipation, according to embodiments of the invention, Hybrid devices 200a-200c include substrate 202, silicon semiconductor layer 204, III-V semiconductor layer 206, and cladding region 208 between silicon semiconductor layer 204 and III-V semiconductor layer 206. Cladding region 208 has a spatial property to substantially confine the optical mode to III-V semiconductor layer 206 and enable heat dissipation through silicon semiconductor layer 204.

FIG. 2a illustrates spatial properties which enable heat dissipation—in this example, thickness 212 and width 214 of cladding region 208. In one embodiment, the spatial property of cladding region 208 which enables heat dissipation includes thickness 212 of cladding region 208. For example, by decreasing the thickness of optical cladding region 208, the thermal impedance of device 200a is decreased. In one such embodiment, a thinner cladding region can result in degraded optical properties (e.g., an increased optical radiation loss into the substrate 202 and decreased confinement in the III-V semiconductor layer 206). Thus, in one embodiment thickness 212 of cladding region 208 is determined by making cladding region 208 as thin as possible while maintaining sufficient guidance of the optical mode. Thickness 212 of cladding region 208 may be determined based on a level of radiation loss that is less than a predetermined threshold. Thus, decreasing thickness 212 of cladding region 208 may result in significant thermal performance with negligible radiation loss as compared to other optical losses present in the device. Thickness 212 can be selected according to a predetermined amount of tolerable radiation loss. In one embodiment, thickness 212 of cladding region 208 is dependent on the profile of optical mode 210 (i.e., the active layer design and overall hybrid cross-section). In other words, depending on the thickness, etches, and overall structure of the III-V semiconductor layer 206 as it determines the shape of optical mode 210 in the III-V or hybrid region, it may be possible to have cladding region 208 with thinner thickness 212 and/or narrower width 214.

Optimized thickness 212 of cladding region 208 can be achieved by optimizing the etch depth of the silicon etch prior to applying the fill (e.g., oxide fill) and chemical mechanical planarization (CMP) process. Optimized thickness 212 can also be achieved by adjusting the amount of CMP polishing. According to one embodiment, optimizing thickness 212 of cladding region 208 involves multiple silicon etches in the SOI processing, such that thickness 212 can be optimized separately from other device aspects achieved with etching (e.g., definition of silicon semiconductor layer 204).

In one embodiment, the spatial property of cladding region 208 which enables heat dissipation includes width 214 of cladding region 208. According to one embodiment, narrowing width 214 of cladding region 208 results in a decreased thermal impedance. In one such embodiment, III-V semiconductor layer 206 extends beyond width 214 of cladding region 208; thus, width 214 of cladding region 208 is made as narrow as possible while keeping the degree of optical degradation insignificant (e.g., under a predetermined value). In one embodiment, optimized width 214 depends on the shape of the optical mode 210 in hybrid device 200a. Optimized width 214 can be implemented by selectively etching the silicon semiconductor layer 204 to the desired width by means of lithographic patterning, a subsequent cladding deposition, and a CMP process.

FIG. 2b and FIG. 2c illustrate a shape of cladding region 208 as a spatial property that enables heat dissipation. FIG. 2b illustrates hybrid device 200b with single thermal shunt 216 in cladding region 208. Cladding region 208 has a shape formed in part by thermal shunt 216 that enables heat dissipation. Thermal shunt 216 can be made from crystalline silicon, polysilicon, or any other material with a higher thermal conductivity than cladding region 208. Thermal shunt 216 does not optically interact with optical mode 210 significantly, due to, for example, having sufficiently small dimensions. For example, thermal shunt 216 can have dimensions smaller than wavelengths of light in silicon semiconductor layer 204 (i.e., smaller than wavelengths of light as altered by the refractive index of the material). In another example, thermal shunt 216 can have dimensions that are on the order of or slightly larger than wavelengths of light in silicon semiconductor layer 204. A shunt with sufficiently small dimensions can be placed directly under the optical mode close to the active region of device 200b and maintain substantial confinement of the optical mode in III-V semiconductor layer 206 (e.g., within acceptable loss levels). In one embodiment, the shape of cladding region 208 formed in part by placing thermal shunt 216 directly under the optical mode enables heat dissipation from one of the hottest regions of device 200b.

The shape of cladding region 208 formed in part by sub-optical wavelength thermal shunt 216 can decrease the thermal impedance of device 200b without significantly affecting the optical properties.

FIG. 2c illustrates hybrid device 200c with plurality of thermal shunts 218 in cladding region 208. Cladding region 208 of device 200c has a shape that enables heat dissipation while again not significantly degrading the optical cladding performance adding negligible absorption and/or scattering loss), and that is formed in part by plurality of thermal shunts 218.

In different embodiments, one or more sub-optical wavelength thermal shunts can vary in number, width, depth, density, and placement. The optimal design of cladding region's shape formed in part by one or several thermal shunts depends on the active material (e.g., the materials) of III-V semiconductor layer 206), the hybrid cross-section, and/or the optical wavelength of interest.

FIG. 3a and FIG. 3b are block diagrams of a hybrid device with a back-filled region and a cladding layer having a spatial property to enable heat dissipation, according to an embodiment of the invention. Hybrid devices 300a and 300b include substrate 302, buried oxide layer 304, silicon semiconductor layer 306, cladding region 308, and III-V semiconductor layer 310. Cladding region 308 has a spatial property to enable heat dissipation. For example, cladding region 308 has a thickness, width, and/or shape to enable heat dissipation.

Hybrid devices 300a and 300b also include region 312 which includes a cavity in substrate 302 and buried oxide layer 304, and which has a thermal conductivity that is higher than the buried oxide layer 304. Although FIG. 3a depicts region 312 as having roughly the same width as III-V silicon semiconductor layer 310, region 312 can have a width smaller or larger than that depicted (see, e.g., the width of region 312 in FIG. 3b, which is larger than III-V silicon semiconductor layer 310). In one embodiment, region 312 further includes filling 314 in the cavity of a material having the thermal conductivity that is higher than the buried oxide layer 304.

According to one embodiment, region 312 is formed by means of a backside via and fill process on an SOI wafer. Another embodiment may be manufactured using a topside process. The backside processing can be done during front-end or back-end processing. In one embodiment, the backside processing includes locally removing a portion of substrate 302 and partially or entirely removing a portion of buried oxide layer 304 in that region. In this embodiment, cladding region 308 between silicon semiconductor region 306 and the III-V semiconductor region 310 confines the optical mode to III-V semiconductor region 310 in the overlapping region. Therefore, in this embodiment, a portion of buried oxide layer 304 can be entirely removed in region 312. A portion of buried oxide layer 304 can be entirely removed for other types of waveguides where the optical mode does not interact with the buried oxide layer. Entirely removing a portion of buried oxide layer 304 below a device can result in lower thermal impedance without significantly degrading the optical performance of the device.

According to one embodiment, the resulting cavity can be filled with a material that has a thermal conductivity based on a thermal operating condition of the device. For example, if hybrid devices 300a and 300b have a high heat dissipation requirement, the cavity in region 312 can be filled with a high thermal conductivity material such as polysilicon, metal, a thermal paste, or any other material with a thermal conductivity that is higher than buried oxide layer 304. FIG. 3b illustrates an embodiment in which the cavity in region 312 extends through silicon semiconductor layer 306. In one such embodiment, a portion of silicon semiconductor layer 306 can be partially or entirely removed in region 312. In yet another embodiment, cladding region 308 is partially or entirely removed in region 312 such that the cavity in region 312 also extends partially or entirely through cladding region 308.

Region 312 in conjunction with the spatial properties of cladding region 308 can enable improved thermal performance for hybrid devices 300a and 300b. Region 312 and the spatial properties of cladding region 308 can also enable the local tailoring of thermal conductivity for hybrid devices 300a and 300b separate from the thermal conductivity for nearby devices on the same photonic integrated circuit.

Figure 4A:
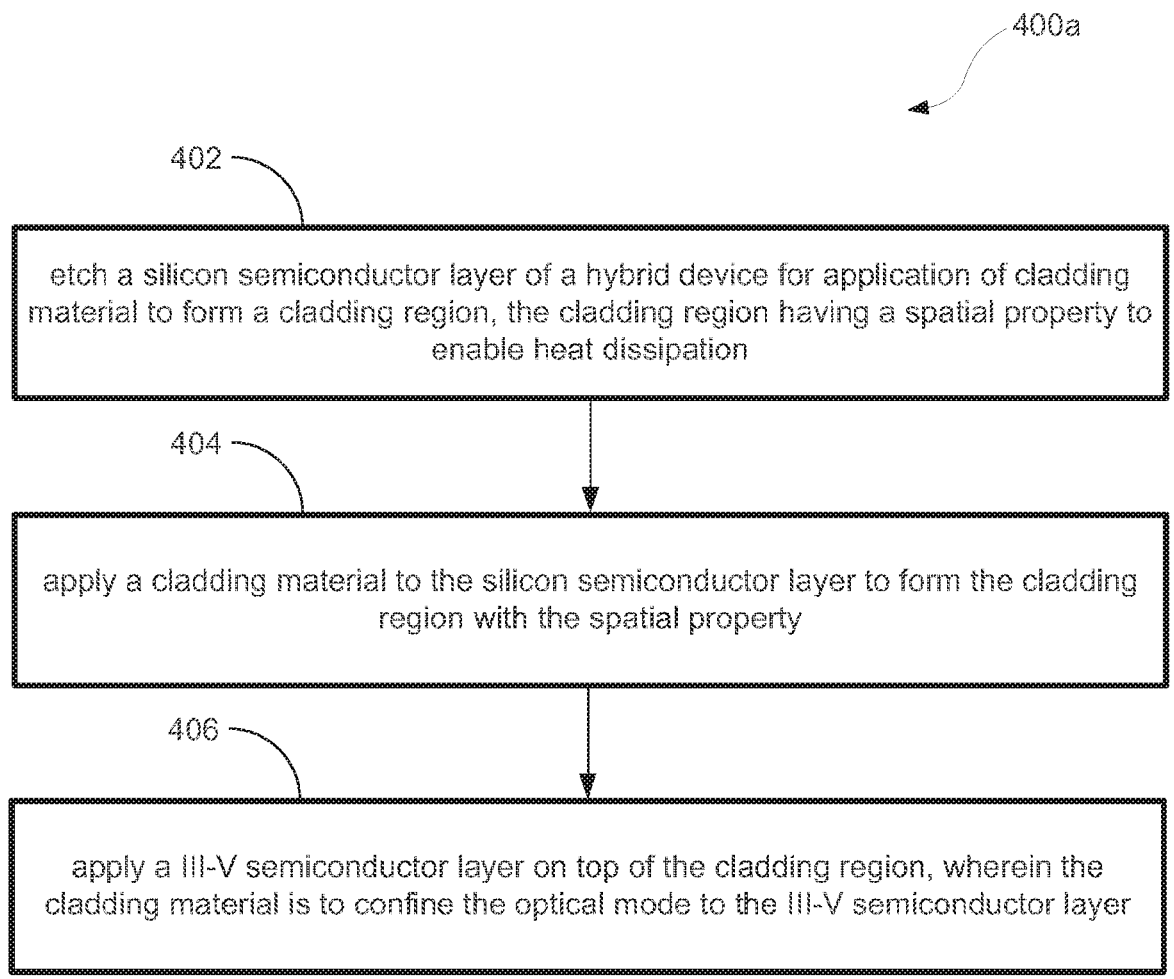
FIG. 4a is a flow diagram of a method of manufacturing a hybrid optical device with a cladding region having a spatial property to enable heat dissipation, according to an embodiment of the invention.

FIG. 4a is a flow diagram of a method of manufacturing a hybrid optical device with a cladding region having a spatial property to enable heat dissipation, according to an embodiment of the invention. Although shown in a particular sequence or order, unless otherwise specified, the order of the actions can be modified. Thus, the illustrated implementations should be understood only as examples, and the illustrated method can be performed in a different order, and some actions may be performed in parallel. Additionally, one or more actions can be omitted in various embodiments of the invention; thus, not all actions are required in every implementation.

Method 400a is one embodiment of a process of manufacturing a hybrid optical device. In this example, manufacturing a hybrid optical device involves etching a silicon semiconductor layer (e.g., layer 204 of FIG. 2a) on a substrate for application of a cladding material to form a cladding region (e.g., cladding region 208 of FIG. 2a), the cladding region having a spatial property to enable heat dissipation through the silicon semiconductor layer, 402. The manufacturing process also includes applying the cladding material to the silicon semiconductor layer and planarizing the cladding material to form the cladding region with the spatial property, 404. Then, the process includes applying a semiconductor layer (e.g., layer 206 of FIG. 2a), 406. The cladding material is to substantially confine an optical mode to the semiconductor layer.

Figure 4B:
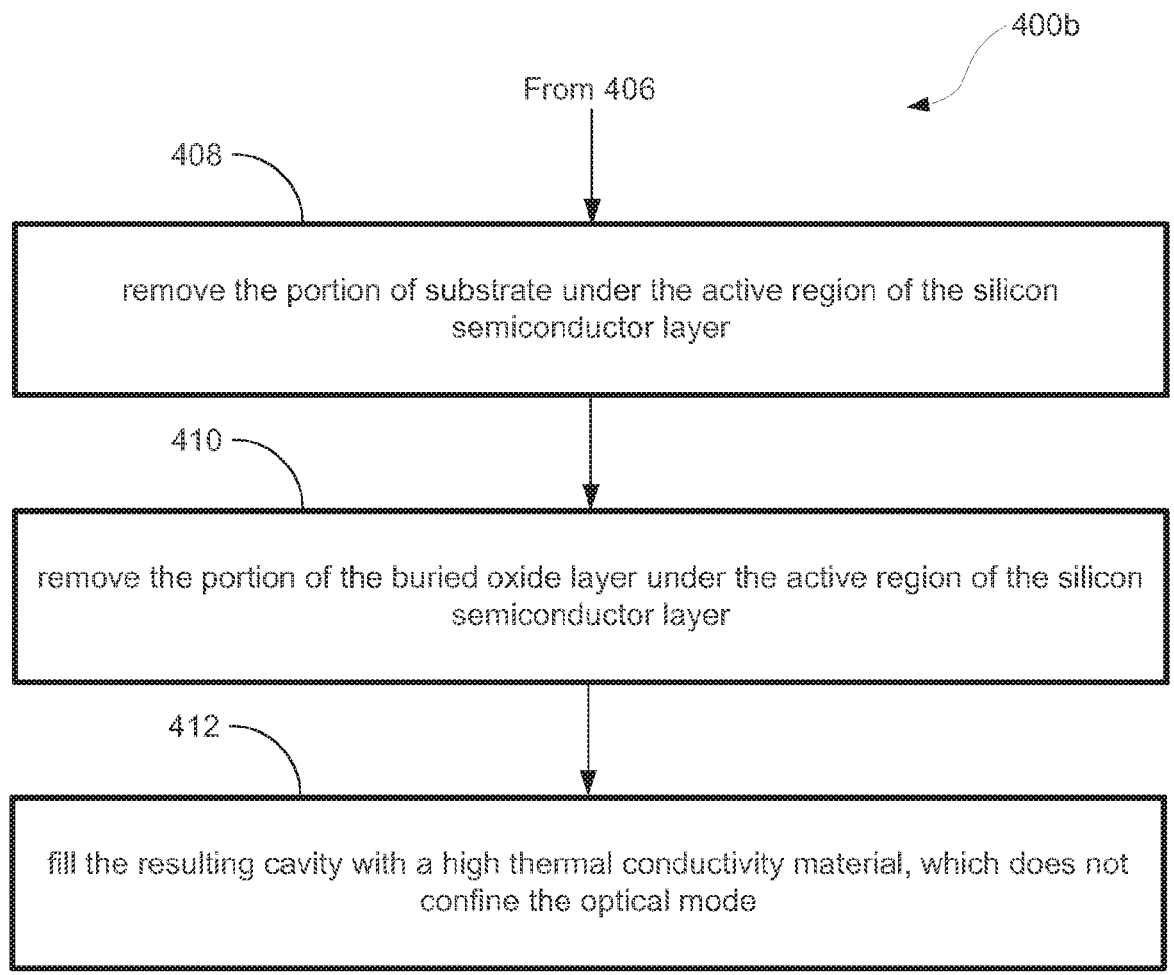
FIG. 4b is a flow diagram of a method of manufacturing a hybrid device including back-filling a region under the active region of a device with a high thermal conductivity material.

In one embodiment, the manufacturing process continues with method 400b of FIG. 4b. FIG. 4b is a flow diagram of a method of manufacturing an optical device including back-filling a region under the active region of a device with a high thermal conductivity material. Method 400b includes removing a portion of the substrate (e.g., a portion of substrate 302 of FIG. 3a or FIG. 3b) and a portion of the buried oxide layer (e.g., a portion of buried oxide layer 304 of FIG. 3a or FIG. 3b) to form a cavity under an active region of the silicon semiconductor layer, 408 and 410. Next, the resulting cavity is filled with a high thermal conductivity material (e.g., filling 314 of FIG. 3a or FIG. 3b), 412. In another embodiment, the cavity is not filled.

Whether filled or not, the resulting region enables heat dissipation through the silicon semiconductor layer.

A variety of spatial properties of a cladding region of an optical device are described above. Different embodiments may include any combination of the above spatial properties, and/or include other spatial properties which both enable heat dissipation and confine the optical mode. For example, although the cladding region is described and illustrated as being defined by a shape with right angles, the cladding region can have any polygonal, aspherical, free-form, or any other shape that enables heat dissipation and substantially confines the optical mode.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

The invention claimed is:

1. An semiconductor device with a waveguide, comprising:
    a cladding layer defining a longitudinal direction transverse to a surface of the cladding layer and a lateral direction parallel to the cladding layer, the cladding layer having a thinner lateral region and a thicker lateral region;
    a silicon semiconductor layer positioned on another surface of the cladding layer opposite the surface of the cladding layer; and
    a III-V semiconductor layer positioned on the surface the cladding layer, the III-V semiconductor layer having an active region with light confined in the III-V semiconductor layer by the thicker lateral region of the cladding layer.

2. The semiconductor device of claim 1, wherein the III-V semiconductor layer includes a further thicker lateral region and a further thinner lateral region, the further thicker lateral region is positioned longitudinally adjacent to at least a portion of the thicker lateral region of the cladding layer.

3. The semiconductor device of claim 2, wherein the further thinner region of the III-V semiconductor layer is positioned longitudinally adjacent to the thinner region of the cladding layer.

4. The semiconductor device of claim 1, wherein the III-V semiconductor layer extends laterally beyond the thicker lateral region of the cladding layer.

5. The semiconductor device of claim 1, wherein the silicon semiconductor layer has an additional thinner lateral region and an additional thicker lateral region, the additional thicker lateral region being thicker than the additional thinner lateral region.

6. The semiconductor device of claim 5, wherein at least a portion of the additional thinner region is positioned longitudinally adjacent to at least a portion of the thinner lateral region of the cladding layer.

7. The semiconductor device of claim 6, wherein at least a portion of the additional thicker region is positioned longitudinally adjacent to at least a portion of the thicker lateral region of the cladding layer.

8. The semiconductor device of claim 1, wherein the thicker and thinner lateral regions of the cladding layer, the further thicker and thinner lateral regions of the III-V semiconductor layer, and the additional thicker and thinner lateral regions of the silicon semiconductor are shaped to form the waveguide for at least a first wavelength of light.

9. The semiconductor device of claim 8, wherein the thicker and thinner lateral regions of the cladding layer and the additional thicker and thinner lateral regions of the silicon semiconductor layer are shaped to form a thermal shunt of silicon extending into the cladding layer.

10. The semiconductor device of claim 9, wherein the thermal shunt has dimensions smaller than the first wavelength of light in the silicon semiconductor layer.

11. The semiconductor device of claim 8, wherein the thicker and thinner lateral regions of the cladding layer and the additional thicker and thinner lateral regions of the silicon semiconductor layer are shaped to form a plurality of thermal shunts of silicon extending into the cladding layer.

12. The semiconductor device of claim 11, wherein each thermal shunt has dimensions smaller than the first wavelength of light in the silicon semiconductor layer.

13. The semiconductor device of claim 1, wherein the cladding layer includes a dielectric material and has a thermal conductivity less than a thermal conductivity of silicon.

14. The semiconductor device of claim 1, further comprising:
    a buried oxide layer positioned on the silicon semiconductor layer, the buried oxide layer including a hole, at least a portion of the hole being longitudinally aligned with at least a portion of the thicker lateral region of the cladding layer.

15. The semiconductor device of claim 14, further comprising:
    a thermally conductive material positioned in the hole, the thermally conductive material having a thermal conductivity greater than a thermal conductivity of the buried oxide layer.

16. The semiconductor device of claim 15, wherein the thermally conductive material is one of: a polysilicon, metal, a thermal paste.

17. The semiconductor device of claim 16, further comprising:
    a substrate positioned on the buried oxide layer, the hole extending through the substrate.

18. The semiconductor device of claim 17, wherein the hole extends to the silicon semiconductor layer.

19. The semiconductor device of claim 18, wherein the thermally conductive material in the hole extends to at least the silicon semiconductor layer.

20. The semiconductor device of claim 14, wherein the hole extends through the silicon semiconductor layer to the cladding layer.

* * * * *